July 10, 1934.

H. F. DALPAYRAT

Re. 19,232

BAND PASS FILTER

Original Filed Nov. 19, 1929

INVENTOR

Henry Francois Dalpayrat

BY

Samuel Ostrolenk

ATTORNEY

Reissued July 10, 1934

Re. 19,232

UNITED STATES PATENT OFFICE 19,232

BAND-PASS FILTER

Henri François Dalpayrat, New York, N. Y., assignor to Radio Patents Corporation, New York, N. Y., a corporation of New York Original No. 1,897,633, dated February 14, 1933, Serial No. 408,304, November 19, 1929. Application for reissue September 25, 1933, Serial No. 690,900

8 Claims. (Cl. 178—44)

This invention relates to improvements in band-pass filters, and in particular, band-pass filters that can be used in radio signaling systems for the purpose of tuning. It is known in the art that in order to improve the quality of tuning, especially where such tuning is made sharp by successive stages of amplification with a tuning arrangement in each stage, or where a number of tuned circuits are coupled in cascade so as to secure a resulting sharp tuning effect, that a general disadvantage becomes apparent in the fact that the higher notes of the received signal are suppressed relatively to the low notes.

The explanation of this action of a sharp filter is generally referred to in terms of frequency bands comprising a radio message, that is, it is assumed that a signal message on the radio channel, consists of a so-called carrier wave and a number of side bands adjacent to the carrier wave and of a frequency departing from a frequency of the carrier wave by an amount equal to the frequency of the note which is being transmitted. Thus, for example, if a thousand cycle note is transmitted on a million cycle wave, it is assumed that there is present a carrier wave of a million cycles and two side bands, one of nine hundred and ninety-nine thousand cycles and another of a million and one thousand cycles. Thus, it becomes apparent that if the tuning in successive stages is brought to a high degree of sharpness, only the carrier wave and the frequencies, differing from it by a very small amount, will be amplified while those differing by a larger amount will be either partially or totally suppressed.

It has also been known in the past that it is possible to construct tuning arrangements which would extend the range of frequencies over which the circuit is tuned for each particular setting, without sacrifice of sharpness. However, all of such arrangements have utilized combinations of several variable elements, such as variable condensers operated simultaneously in such a way that the effect of each of the tuning elements is superimposed on the effect of the others with the resultant summation of tuning curves to secure a response over a relatively wide frequency range.

The disadvantage of these old arrangements lies in the necessity of multiple tuning elements at each stage or a combination of staggered tuning elements at several stages, whereby the construction of the set is unnecessarily complicated or else the energy amplification at each of the staggered stages of tuning does not reach its maximum amount, since the maximum amplification will only occur when exact tuning is set at each stage.

The object of my invention is to overcome the above disadvantages of mechanical complication and loss of energy, by providing a band-pass filter with only one variable element but so arranged that the frequency range over which the tuning element is effective, is sufficiently wide to cover all of the side bands in the transmitted message, and that this frequency band can be shifted over the full range of wave lengths or frequencies to which the signaling set may be tuned without impairing its selective qualities over the transmitted frequency band.

The other objects of my invention will become apparent and will be explained at length hereinafter.

I have described my invention in reference to the following figures, wherein Figure 1 is the preferred embodiment of the circuit of a band-pass filter.

Figure 1:
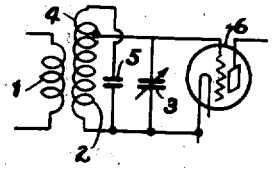
Figure 1A:
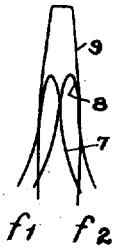
Figure 3:
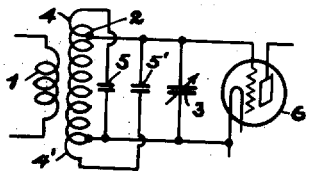
Figure 3 is another alternative arrangement.
Figure 3A:
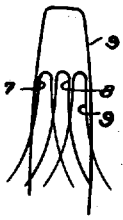

Figures 1*a* and 3*a* illustrate the signal response curves obtained in the circuits shown in Figures 1 and 3, respectively.

Figure 4:
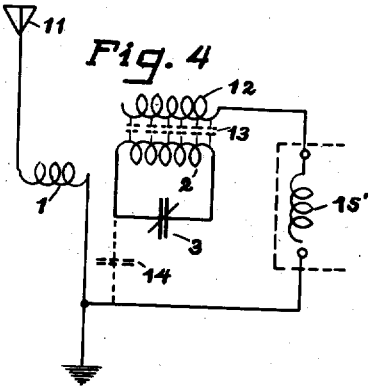

Figure 4 is another alternative arrangement, and

Figure 5:
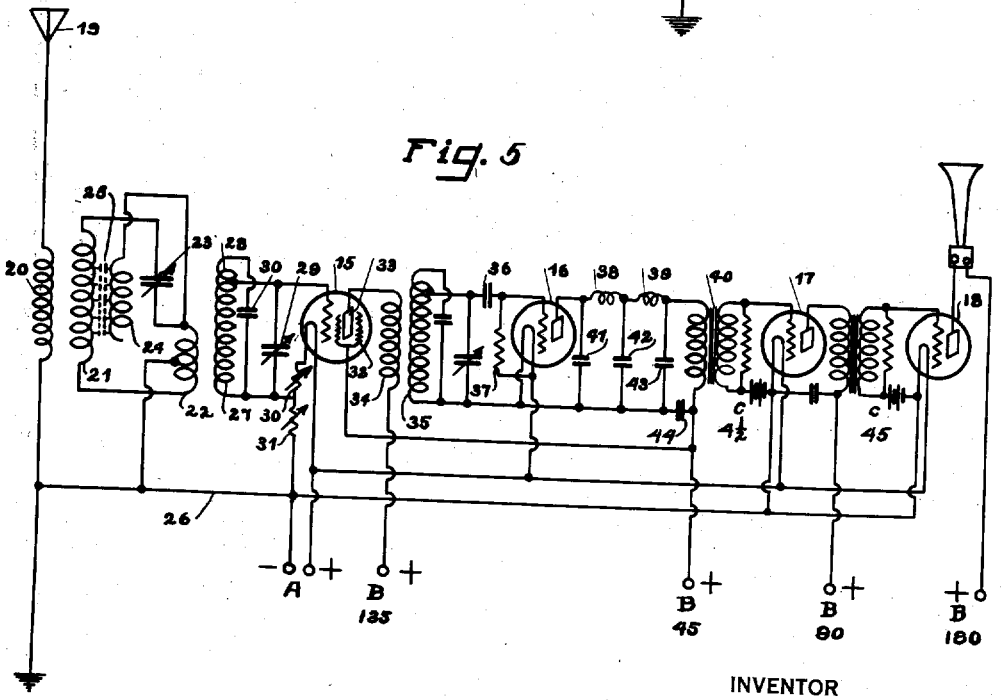

Figure 5 is a complete diagram of a radio receiving set, utilizing the preferred form of my band-pass filter in all of the stages and the band-pass filter of Figure 3 in the antenna circuit.

Referring to Figure 1, I have shown diagrammatically, a thermionic tube input circuit consisting of a primary coil 1, a secondary or tuning coil 2, a tuning condenser in parallel with coil 2, an extension of coil 2 marked 4, and a small fixed condenser 5 connected to said extension 4. These tuning elements are shown connected between the filament and grid circuits of the thermionic tube 6.

I have shown in Figure 1*a*, the signal response of the two alternative circuit paths and their resultant effect in securing band-pass filter action. In this Figure 1*a*, line 7 may indicate the frequency response of the circuit comprising inductance 2 and condenser 3 alone. The curve 8 represents the response of the inductance 2 and condenser 3 in combination with the extension of inductance coil 4 and the small fixed capacity 5.

On account of the relatively small size of this small fixed condenser, the amount of energy shunted therethrough, is only a fraction of the total energy of the circuits and its effect will therefore merely be to widen the frequency band without changing appreciably the resonant point of the main tuning circuit consisting of inductance 2 and condenser 3. I thus secure the effect of two peaks on the frequency response curve and the combination as illustrated by item 9 is the desired band-pass filter action, wherein the response is relatively constant over the frequency range $f_1$ and $f_2$ as indicated.

Figure 2:
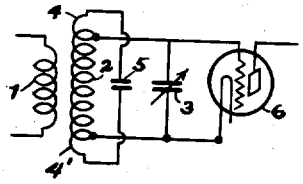
Figure 2 is an alternative arrangement of a band-pass filter.

In Figure 2, I have shown an alternative arrangement, where the elements of the circuit corresponding to the elements of the circuit of Figure 1, are marked by the same numerals. I have shown that the inductance coil 2 is extended at both ends as shown at 4 and 4', and the small fixed condenser 5 is now connected between these two extensions. The effect of this band-pass filter is identical to that of Figure 1.

In Figure 3, I have shown an alternative arrangement which is capable of further widening the frequency range to which this tuned circuit is responsive. Again, the input coil 1 is coupled to the inductance 2, tuned by means of variable condenser 3, and the extension 4 is connected to a small fixed capacity 5, while the extension 4' is connected to a similar small capacity 5'. I have indicated in Figure 3*a* the frequency response characteristics of this type of filter, which will be seen to consist of three peaks corresponding respectively, curve 7 to the circuit of coil 2, and capacity 3, curve 8 to extension 4 and condenser 5 added to the action of the inductance 2 and condenser 3, the curve 10, which is the further addition of extension 4' and condenser 5', to the action of the additional circuits and curve 9, which represents the resultant band-pass filter action of this circuit between frequency ranges of $f_1$ and $f_3$.

In Figure 4, I have shown an alternative arrangement, wherein the input circuit from the antenna 11 contains the primary coil 1, the latter being coupled to the secondary coil 2 with a tuning condenser 3. In close proximity to coil 2, I mount a coil 12 of relatively large number of turns, in such manner that between coil 2 and 12, there exists distributed capacity as indicated by dotted lines 13, which acts as an effective coupling element. The structure of the variable condenser 3 is also coupled to the earth potential either through a distributed capacity as indicated at 14, or by metallic connection. The coil 12 is directly connected to the input circuit of a receiver 15'.

In this arrangement, the effect of the small fixed capacity is secured by the distributed capacity 13 and 14. In particular, the distributed capacity 13 extends to different portions of the coil 12, in such a way that each of the convolutions of the coil 12 represents a small auxiliary circuit relative to that distributed capacity. In this way, I am able to secure a very effective band-pass filter action, since a succession of frequency response curves will correspond to each one of the convolutions of the inductance coil 12 and the resultant frequency response is the summation of the same.

The capacity of the tuned circuit is in capacity relation with any portion of the circuit connections to the terminal opposite the open end of the open-ended coil. These circuit connections carry the current which is transmitted across the distributed capacity.

The effect of all this is that energy received over the inductance 1 is transferred to inductance 15 inductively, as through winding 1 in inductive relation with winding 2, and capacitatively as through the distributed capacity between winding 2 and open-ended coil 12.

In Figure 5, I have shown a complete radio receiving circuit, including the arrangements according to my invention. This will be seen to consist of a four-tube radio set with one radio frequency amplifier 15, one detector 16 and two audio-frequency amplifiers 17 and 18. The coupling between the antenna 19 and the radio frequency amplifier tube 15 is obtained by means of two tuned circuits, each one of which includes modifications of my band-pass filter. Thus, the antenna circuit contains a coupling coil 20 with a secondary 21 in the first band-pass filter. This coil 21 together with primary 22 of the next coupling transformer is tuned by means of variable condenser 23. In close proximity to coil 21, there is located an open-end coil 24 possessing distributed capacity relation to winding 21 as indicated by dotted lines at 25. This open-end coil is connected to the primary of the next coupling transformer 22. This coupling transformer 22 may have a central tap 23' connected to ground lead 26. I have found that this kind of connection of the primary 22 also has the effect of producing a flat topped response curve of the circuit, which under certain circumstances makes it possible to dispense with the coil 24. As is apparent, this connection of the coil 22 to the ground or zero reference point of the system; that is, at an intermediate point on the coil, is in its effect equivalent to a coupling circuit circuit associated with the main circuit similar to the arrangement described in Figures 1 to 3. I have found that it is not absolutely necessary to insert a condenser, corresponding to the condenser item 5 of the previous figures, between the lower ends of coils 22 and 21, but that a direct connection as shown in the drawing will, in most cases, give a favorable result.

The coil 22 is coupled to the secondary 27 which is a part of a band-pass filter circuit similar to Figure 1 and includes an extension 28 of the coil 27, a variable condenser 29, and a fixed condenser 30 in the same relation as in Figure 1. The output leads of coil 27 are connected to filament and grid leads of tube 15. An adjustable resistor 30 may be included in the filament of this tube for controlling the grid bias, although in practice, I preferably use a fixed resistance. An adjustable resistance 31 in the filament lead of this tube serves to control the amount of amplification by changing the filament current. The tube 15 may be of the so-called screen grid type and the screen grid 32 is connected to a 45-volt lead suitable for this tube. The plate 33 of the tube 15 is connected to the primary 34 of a coupling transformer, the secondary of which 35, is again a part of a band-pass filter, similar to that of Figure 1. The output of this band-pass filter is shown to be connected to the grid and filament of detector tube 16 with a grid condenser 36 in series with the grid lead and a grid-leak 37 between said grid and the lead of said filament. The plate of the tube 16 is connected through two radio frequency choke coils 38 and 39 to an audio frequency transformer 40. I supply also by-pass condensers 41, 42, 43 and 44, by means of which it is possible to restrict the input transformer 40 to audio frequencies only. The audio frequency part of this circuit is of a conventional arrangement with suitable grid bias and smoothing resistors.

It will be seen that in this arrangement, there are three variable condensers and three corresponding band-pass filters, by means of which I am able to secure a high degree of selectivity without any sacrifice of the side bands. The modification of the band-pass filter, which is directly coupled to the antenna includes also the distributed capacity element 25, which, as described in connection with Figure 4, possess peculiar advantages, but for the other stages of band-pass filtering, I use the circuits of Figure 1 which permit simpler arrangements of circuits for securing a high grid control voltage. By the arrangement of these circuits, I have not only been able to secure a high degree of selectivity, but I also utilize the so-called screen-grid tube to its fullest degree of amplification, and I am able to simplify the construction of the set insofar as the amplification of this one tube 15 in connection with the band-pass filters becomes practically equivalent to two or three stages of radio frequency secured by either means alone. It has been found experimentally that the widening of band-pass frequencies secured by my band-pass filters permits a larger amount of energy to be transmitted through the stages of amplification, and in this way, the apparent amplification as noted by audible signals, is correspondingly increased.

It will be apparent that the particular connections of my band-pass filter and of the radio receiving circuit may be changed, still utilizing the principles of my invention to meet the various requirements as will be understood by those skilled in the art, without departing from the scope of my invention as defined by the appended claims.

I claim:

1. In a band pass circuit; a source of high frequency signals having an inductance connected to said source; a tuned resonant circuit consisting of a second inductance and a variable capacity, said second inductance being in inductive relation with said first mentioned inductance and a second non-resonant circuit consisting of a third inductance in inductive relation with said second inductance and a capacitance of relatively small value compared with the capacity of said variable condenser, said capacitance of relatively small value and said third inductance affecting the total inductance and capacity of said tuned circuit to broaden its response characteristic.

2. In a band pass circuit; a source of high frequency signals having an inductance connected to said source; a tuned resonant circuit including a second inductance and a variable capacity, said second inductance being in inductive relation with said first mentioned inductance; a third inductance of relatively few turns compared to the turns of said tuned circuit inductance, one terminal of said third inductance being connected to one terminal of said second inductance; a capacitance of relatively small value compared with the capacitance of said tuned circuit capacity; the terminal opposite said one terminal of said third inductance being connected to one terminal of said small capacitance and the opposite terminal of said small capacitance being connected to the opposite terminal from said one terminal of said second inductance.

3. In a band pass circuit; a source of high frequency signals having an inductance connected to said source; a tuned resonant circuit including a second inductance and a variable capacity, said second inductance being in inductive relation with said first mentioned inductance; a pair of inductances of relatively few turns compared to the tuned circuit inductance connected to opposite terminals of said second inductance; and a capacitance of small capacity compared with the capacitance of said tuned circuit capacity connected to ends of said pair of inductances.

4. In a transfer circuit; a source of high frequency signals having an inductance connected to said source; a tuned resonant circuit including a second inductance and a variable capacity, said second inductance being in inductive relation with said first mentioned inductance; a third inductance in inductive relation with said inductances, one end of said third inductance being open; a receiving circuit; a distributed capacitance between said third inductance and second inductance of relatively small value compared with the capacitance of said tuned circuit capacity; and circuit connections including said capacitance of relatively small value and said tuned circuit for transferring energy from said first mentioned inductance to said receiving circuit.

5. In a band-pass filter; an input circuit having an inductance; a tuned circuit having capacity and inductance, the inductance being coupled with said first mentioned inductance; a third inductance in close inductive relation with the inductance of the tuned circuit and having distributed capacity therewith, said third coil being open at one terminal thereof; a receiving circuit; and circuit connections including a connection from the opposite terminal of said third inductance to said receiving circuit and said small capacitance for transferring energy from said first mentioned inductance through said tuned circuit and said capacitance to said receiving circuit.

6. In a transfer circuit; a source of high frequency signals having an inductance connected to said source; a tuned resonant circuit including a second inductance and a variable capacity, said second inductance being in inductive relation with said first mentioned inductance; a third inductance in inductive relation with said inductances, one end of said third inductance being open and producing with said second inductance a distributed capacitance of relatively small value compared with the capacitance of said tuned circuit; a receiving circuit; and circuit connections including said inductances, said distributed capacitance and said tuned circuit transferring energy from said source to said receiving circuit.

7. In a band-pass filter; an input circuit having an inductance, a tuned circuit having capacity and inductance, the inductance being coupled with said first mentioned inductance, a third inductance in close inductive relation with the inductance of the tuned circuit and having distributed capacity therewith, said third inductance being open at one terminal thereof and circuit connections to the opposite terminal thereof, said capacity of the tuned circuit being in capacity relation with said circuit connections.

8. In a band-pass filter; an input circuit having an inductance, a tuned circuit having capacity and inductance, the inductance being coupled with said first-mentioned inductance, a third inductance having a relatively large number of turns in close inductive relation with the inductance of the tuned circuit and having distributed capacity therewith, said third inductance being open at one terminal thereof and circuit connections to the opposite terminal thereof, said capacity of the tuned circuit being in capacity relation with said circuit connections.

HENRI FRANÇOIS DALPAYRAT.